(12) United States Patent
Kenworthy et al.

(10) Patent No.: US 8,852,685 B2
(45) Date of Patent: Oct. 7, 2014

(54) COATING METHOD FOR GAS DELIVERY SYSTEM

(75) Inventors: Ian Kenworthy, Campbell, CA (US); Duane Outka, Fremont, CA (US); Fangli Hao, Cupertino, CA (US); Leonard Sharpless, Fremont, CA (US); Yijun Du, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 890 days.

(21) Appl. No.: 12/766,529

(22) Filed: Apr. 23, 2010

(65) Prior Publication Data

US 2011/0259519 A1 Oct. 27, 2011

(51) Int. Cl.
*C23F 1/08* (2006.01)
*B05D 7/22* (2006.01)

(52) U.S. Cl.
CPC ...................................... *B05D 7/222* (2013.01)
USPC .......................................................... 427/235

(58) Field of Classification Search
USPC ................................................ 427/230–239
See application file for complete search history.

(56) References Cited

U.S. PATENT DOCUMENTS

| | | | |
|---|---|---|---|
| 3,930,754 A | 1/1976 | Mogg et al. | |
| 4,071,641 A | 1/1978 | Susai | |
| 5,945,486 A | 8/1999 | Vargo et al. | |
| 6,365,227 B2 | 4/2002 | Zdunek et al. | |
| 6,444,083 B1 * | 9/2002 | Steger et al. | 156/345.48 |
| 6,682,627 B2 | 1/2004 | Shamouilian et al. | |
| 6,818,320 B2 | 11/2004 | Ohmi et al. | |
| 6,926,039 B2 | 8/2005 | Marion | |
| 7,135,426 B2 | 11/2006 | Murugesh et al. | |
| 7,234,222 B1 | 6/2007 | Hao et al. | |
| 7,300,684 B2 | 11/2007 | Boardman et al. | |
| 2001/0017300 A1 | 8/2001 | Zdunek et al. | |
| 2002/0066532 A1 | 6/2002 | Shih et al. | |
| 2004/0076837 A1 | 4/2004 | Hein et al. | |
| 2004/0112536 A1 | 6/2004 | Quon | |
| 2004/0255868 A1 | 12/2004 | AmRhein et al. | |
| 2006/0286775 A1 | 12/2006 | Singh et al. | |
| 2006/0286776 A1 | 12/2006 | Ranish et al. | |
| 2008/0092806 A1 | 4/2008 | West et al. | |
| 2008/0241517 A1 | 10/2008 | Kenworthy et al. | |

FOREIGN PATENT DOCUMENTS

| | | | |
|---|---|---|---|
| GB | 2428604 A | | 2/2007 |
| JP | 2008-184662 A | | 8/2008 |
| KR | 10-2003-0073648 A | * | 9/2003 |
| KR | 10-2007-0068311 A | * | 6/2007 |
| WO | WO 98/18852 | | 5/1998 |

OTHER PUBLICATIONS

Permabond® HL126 High Strength, Low Viscosity Anaerobic Threadlocker, Permabond® Engineering Adhesives, pp. 1-5 (http://www.permabond.com).
International Search Report and Written Opinion mailed Jan. 2, 2012 for PCT/US2011/000683.

* cited by examiner

*Primary Examiner* — William Phillip Fletcher, III

(74) *Attorney, Agent, or Firm* — Buchanan Ingersoll & Rooney PC

(57) ABSTRACT

A method of coating the inner surfaces of gas passages of a gas delivery system for a plasma process system such as a plasma etching system includes (a) flowing a fluidic precursor of a corrosion-resistant material through the gas passages and depositing a layer of the fluidic precursor to completely coat the inner surfaces of the gas passages; (b) removing excess fluidic precursor from the inner surfaces; (c) curing the deposited layer of the fluidic precursor to form a corrosion-resistant material coating.

11 Claims, 2 Drawing Sheets

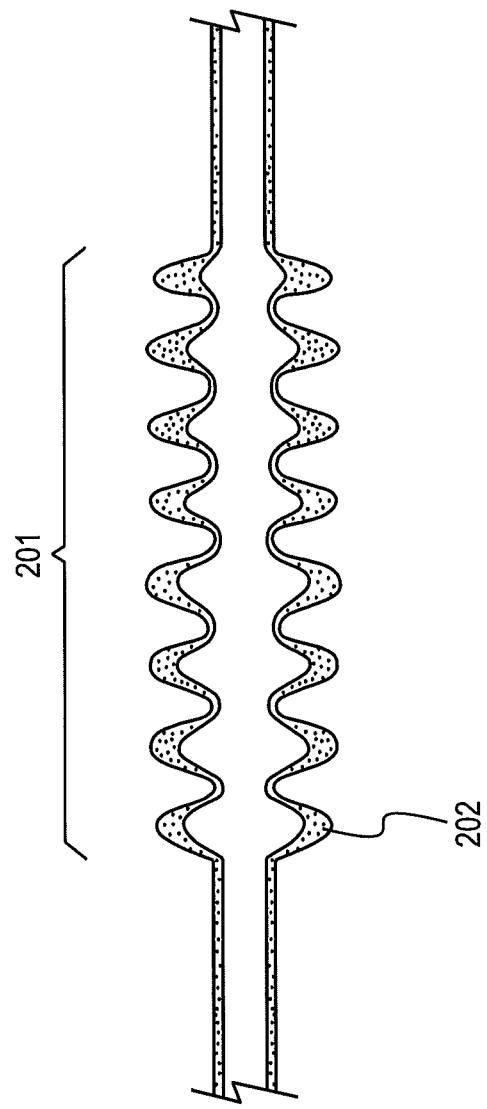

COATING METHOD FOR GAS DELIVERY SYSTEM

BACKGROUND OF THE DISCLOSURE

In the processing of a substrate, e.g., a semiconductor substrate or a glass panel such as one used in flat panel display manufacturing, plasma is often employed. As part of the processing of a substrate (plasma etching, chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and added (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing parts of the underlying substrate to become exposed. The substrate is then placed in a chamber of a plasma processing system on a substrate support structure comprising a mono-polar or bi-polar electrode, called a chuck. Appropriate process gases (e.g., $C_4F_3$, $C_4F_6$, $CHF_3$, $CH_2F_2$, $CF_4$, $CH_3F$, $C_2F_4$, $N_2$, $O_2$, HBr, Ar, Xe, He, $H_2$, $NH_3$, $SF_6$, $BCl_3$, $Cl_2$, etc.) are then flowed into the chamber through gas passages of a gas delivery system and ionized to form a plasma to etch exposed areas of the substrate. Halogen-containing process gases are highly corrosive and can damage inner surfaces of the gas passages.

SUMMARY OF THE INVENTION

A method is disclosed for coating inner surfaces of gas passages of a gas delivery system configured to deliver process gases into a chamber of a plasma processing system, the method comprising (a) flowing a fluidic precursor of a corrosion-resistant material through the gas passages and depositing a layer of the fluidic precursor to completely coat the inner surfaces of the gas passages; (b) removing excess fluidic precursor from the inner surfaces; (c) curing the deposited layer of the fluidic precursor to form a corrosion-resistant material coating.

BRIEF DESCRIPTION OF DRAWINGS

FIG. 2 shows accumulation of a fluidic precursor of a corrosion-resistant material in convolutions of a bellows.

DETAILED DESCRIPTION

Figure 1:
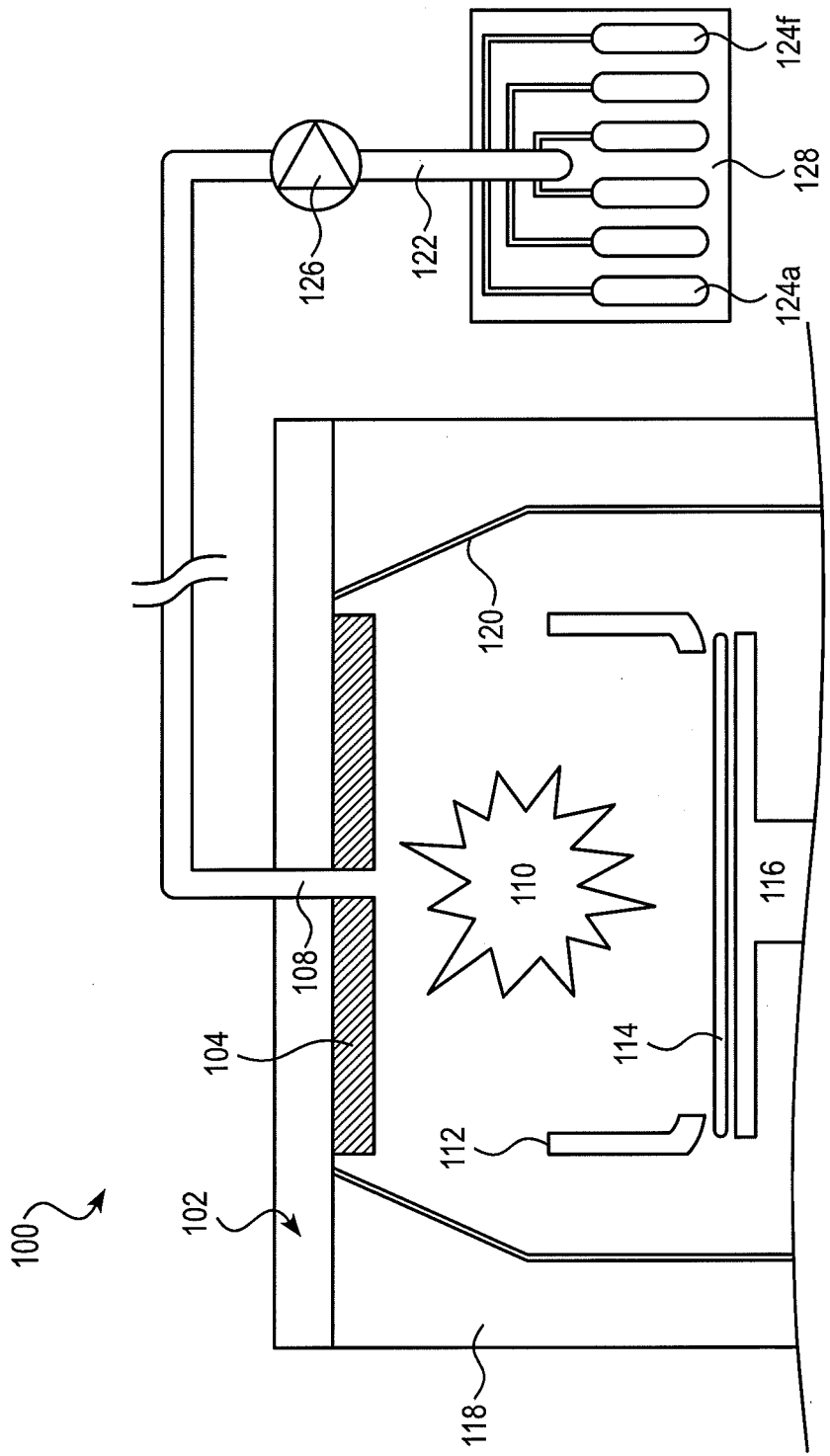
FIG. 1 shows a simplified cross-sectional view of a plasma processing system.

FIG. 1 shows a simplified cross-sectional view of a plasma processing system 100. Generally, one or more process gases are flowed into chamber 102 through an inlet 108 from gas delivery system 122. These process gases may be subsequently ionized to form a plasma 110, in order to process (e.g. etching or depositing on) exposed areas of substrate 114, such as a semiconductor substrate or a glass panel, positioned on an electrostatic chuck 116. Showerhead electrode 120, along with liner 112, help to optimally focus plasma 110 onto substrate 114.

Gas delivery system 122 can include one or more mass flow controllers connected to compressed gas cylinders 124a-f containing plasma processing gases (e.g., $C_4F_3$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a-f may be further protected by an enclosure 128 that provides local exhaust ventilation. Mass flow controller 126 can be a self-contained device (consisting of a transducer, control valve, and control and signal-processing electronics) used in the semiconductor industry to measure and regulate the mass flow of gas to the plasma processing system. Gas delivery system 122 includes gas passages in which process gases flow. Various components of the gas delivery system are interconnected by tubing and bellows sections which allow movement of some components such as a processing chamber door.

Delivery of ultrapure process gases is needed during plasma processing to maximize productivity and yield in semiconductor fabs. The delivery of such gases poses special challenges, however, because of their highly corrosive and reactive nature.

In particular, corrosion created in the gas delivery system may substantially reduce substrate yield. For example, in the process of etching a substrate, pollutants may be generated from materials in the process gases (e.g., carbon, fluorine, hydrogen, nitrogen, oxygen, silicon, boron, chlorine, etc.), from materials in the substrate (e.g. photoresist, silicon, oxygen, nitrogen, aluminum, titanium, etc.), or from structural materials within the plasma processing chamber or gas delivery system (e.g., stainless steel, aluminum, quartz, etc.).

In semiconductor production, a particle one-tenth the size of a device feature being manufactured can substantially damage the device. Subsequently, components in contact with the process gases are generally engineered to minimize or eliminate potential sources of system contamination. Since a gas delivery system may be a significant source of contamination, gas passages are often made of a set of selected metals (e.g., electropolished stainless steel, copper (Cu), aluminum (Al), metal alloys, etc.).

For example, stainless steel is an iron (Fe) based alloy, with significant alloying additions of chromium (Cr), which gives the metal its "stainless" or corrosion-resistant characteristics, and nickel (Ni), which stabilizes the austenite and makes the metal nonmagnetic and tough. Electropolishing generally improves the surface chemistry of the part, enhancing the passive oxide film and removing any free iron from the surface.

In general, stainless steel comprises a "passive" film coating which is resistant to further "oxidation" or rusting. This film forms rapidly when exposed to oxygen. Once formed the metal has become "passivated" and the oxidation or "rusting" rate will substantially slow down.

Despite efforts to reduce corrosion, such electropolishing, passivation, mirror-smooth surface finish (Ra<5 mil), corrosion still occurs due to long-term exposure to process gases, especially in certain areas such as portions near weld joints and portions of stainless steel gas passages which are periodically exposed to moisture.

The degree of corrosion and hence the amount of contamination may depend on many factors, such as gas concentration and purity, moisture content, temperature, localized inhomogeneities in gas passage material, system flow rates, time of exposure, frequency of exposure. For instance, halogen containing gases, such as hydrogen chloride or hydrogen bromide, can corrode stainless steel when moisture levels exceed a few parts per million (ppm).

Although moisture can be reduced, it generally cannot be completely eliminated. For example, although plasma processing gases are normally stored in a purified form in compressed gas cylinders, moisture can be introduced into the gas delivery system when the cylinders are replaced, or when maintenance is performed on the processing chamber.

Although the actual amount of corrosion in stainless steel tends to be small, the amount of iron and chromium released from corroded areas can be carried by gas flow in the stainless steel gas passages to a plasma processing chamber in which semiconductor substrates undergo processing. As a result, serious contamination of semiconductor substrates processed in the plasma processing chamber can occur. Typical tolerance of iron or chromium contamination on substrates is less than $5.0\times10^{10}$ atoms/cm$^2$. Hence, measures to prevent or significantly reduce corrosion of stainless steel gas passages are desirable. One approach for reducing corrosion in the gas delivery system is to prevent stainless steel gas passages (e.g. tubing and bellows) from contacting corrosive gases.

One method under this approach is to use corrosion-resistant tubing (e.g. polyethylene tubing, polypropylene tubing, flexible glass tubing, metal-coated plastic tubing, ceramic tubing, laminate tubing with a conductive shield sandwiched between two layers of plastic, or anodized aluminum).

Commonly assigned U.S. Pat. No. 7,234,222 which is hereby incorporated by reference, discloses methods of bonding or injection molding a plastic sleeve onto the interior surface of stainless steel tubing.

Described herein are embodiments of a flow coating method in which a fluidic precursor of a corrosion-resistant material is passed through gas passages of a gas delivery system so as to deposit a layer of the fluidic precursor on inner surfaces of the gas passages and the layer of the fluidic precursor deposited is cured to form a layer of corrosion-resistant material on the inner surfaces of the gas passages. The gas passages can be formed by welding metal (such as stainless steel) tubing, bellows, fittings, flanges, valves and the like. The flow coating method is effective to coat inner surfaces with complex geometry and/or small diameter (e.g. inner surfaces of bellows or inner surfaces of tubing with an outer diameter of 0.25 inch or less).

An embodiment of the flow coating method comprises the following steps: (a) cleaning inner surfaces of gas passages of a gas delivery system with suitable detergents and/or suitable chemicals (e.g. with 10 to 20 wt. % nitric acid for 3 minutes and rinsing the interior surface with deionized water for at least 5 minutes); (b) drying the inner surfaces (e.g. by blowing dry nitrogen or dry air through the gas passages and baking the gas passages at a temperature of at least 120° C. in a vacuum oven); (c) flowing a fluidic precursor of a corrosion-resistant material (e.g. HL126 liquid polymer precursor manufactured by PERMABOND or methacrylate esters) through the gas passages and depositing a layer of the fluidic precursor to coat the inner surfaces of the gas passages; (d) removing excess fluidic precursor from the inner surfaces (e.g. by blowing dry nitrogen or dry air into the gas passages); (e) curing the deposited layer of the fluidic precursor to form a corrosion-resistant material coating (e.g. by baking the gas passages at a temperature of at least 100° C. and a pressure of 1 to 10 Torr in a vacuum oven or by maintaining the gas passages at ambient temperature and pressure for at least 24 hours). A same second coating can be applied. The resultant coating can have a thickness from 0.0014 to 0.0034 inch thick and non-brittle.

As shown in FIG. 2, however, if the gas passages comprise bellows 201 welded to other components of the gas passages (e.g. tubing, fittings, valves, flanges, etc.), the fluidic precursor can accumulate at convolutions 202 of the inner surfaces of the bellows 201, and cure into an excess of the corrosion-resistant material at the convolutions 202, which may flake off and become particulate contamination.

Inspection of uncoated stainless steel bellows in a gas delivery system after prolonged exposure to corrosive gases revealed that the convolutions of the bellows did not show any sign of corrosion, while the other components and weld joints between the components in this gas delivery system showed serious corrosion. Thus, a selectively coating method, wherein a corrosion-resistant material coating is applied on all inner surfaces of gas passages of a gas delivery system while leaving inner surface of bellows therein uncoated, can eliminate the problem of accumulation of corrosion-resistant material in bellows convolutions.

One embodiment of the selective coating method comprises the following steps: (a) prior to welding the bellows to the rest of the gas passages, coating the inner surfaces of the bellows with a masking agent such as photoresist, oil, silane and/or alkoxysilanes (silane and/or alkoxysilanes can provide a layer of silanization on the inner surfaces of the bellows) that prevents adhesion of the fluidic precursor; (b) welding the bellows to the other components; (c) flowing the fluidic precursor (e.g. HL126 liquid polymer precursor or methacrylate esters) through the gas passages and depositing a layer of the fluidic precursor to coat the inner surfaces of the gas passages except the inner surfaces of the bellows; (d) removing excess fluidic precursor (e.g. by blowing dry nitrogen or dry air into the gas passages); (e) curing the deposited layer of the fluidic precursor (e.g. by baking the gas passages at a temperature of at least 100° C. and a pressure of 1 to 10 Torr in a vacuum oven or by maintaining the gas passages at ambient temperature and pressure for at least 24 hours); (f) optionally, removing the masking agent from the inner surfaces of the bellows.

The masking agent can be photoresist, oil, silane, alkoxysilanes or other suitable materials. The fluidic precursor can be HL126 polymer or methacrylate esters or other suitable materials. The masking agent can be removed (e.g. dissolved, etched, etc.) by acetone, photoresist remover or other suitable materials.

While the methods of coating the inner surfaces of gas passages of a gas delivery system have been described in detail with reference to specific embodiments thereof, it will be apparent to those skilled in the art that various changes and modifications can be made, and equivalents employed, without departing from the scope of the appended claims.

We claim:

1. A method for coating inner surfaces of gas passages of a gas delivery system configured to deliver process gases into a chamber of a plasma processing system wherein semiconductor substrates are processed, the method comprising:
   (a) flowing a fluidic precursor of a corrosion-resistant material through the gas passages and depositing a layer of the fluidic precursor to coat the inner surfaces of the gas passages;
   (b) removing excess fluidic precursor from the inner surfaces;
   (c) curing the deposited layer of the fluidic precursor to form a corrosion-resistant material coating;
   wherein
      the gas passages deliver process gases into the chamber of the plasma processing system; and
      the fluidic precursor is a liquid.

2. A method for coating inner surfaces of gas passages of a gas delivery system configured to deliver process gases into a chamber of a plasma processing system wherein semiconductor substrates are processed, the method comprising:
   (a) flowing a fluidic precursor of a corrosion-resistant material comprising one or more methacrylate esters through the gas passages and depositing a layer of the fluidic precursor to coat the inner surfaces of the gas passages;

(b) removing excess fluidic precursor from the inner surfaces by blowing dry nitrogen or dry air into the gas passages;
(c) curing the deposited layer of the fluidic precursor to form a corrosion-resistant material coating by baking the gas passages at a temperature of at least 100° C. and a pressure of 1 to 10 Torr in a vacuum oven or by maintaining the gas passages at ambient temperature and pressure for at least 24 hours;
wherein the gas passages deliver process gases into the chamber of the plasma processing system.

3. The method of claim 1, further comprising before flowing the fluidic precursor, cleaning the inner surfaces and drying the inner surfaces.

4. The method of claim 3, wherein:
the inner surfaces are cleaned with 10 to 20 wt. % nitric acid for 3 minutes and rinsing the interior surface with deionized water for at least 5 minutes; and
the inner surfaces are dried by blowing dry nitrogen or dry air through the gas passages and baking the gas passages at a temperature of at least 120° C. in a vacuum oven.

5. The method of claim 1, wherein the gas passages are in stainless steel tubing having an outer diameter of 0.25 inch or less.

6. The method of claim 5, wherein at least one stainless steel bellows is welded to the stainless steel tubing.

7. A method for coating inner surfaces of gas passages of a gas delivery system configured to deliver process gases into a chamber of a plasma processing system wherein semiconductor substrates are processed, the method comprising:

(a) flowing a fluidic precursor of a corrosion-resistant material through the gas passages and depositing a layer of the fluidic precursor to coat the inner surfaces of the gas passages;
(b) removing excess fluidic precursor from the inner surfaces;
(c) curing the deposited layer of the fluidic precursor to form a corrosion-resistant material coating;
wherein
the gas passages deliver gases into the chamber of the plasma processing system;
the gas passages are in stainless steel tubing having an outer diameter of 0.25 inch or less;
at least one stainless steel bellows is welded to the stainless steel tubing;
prior to welding the bellows to the tubing, coating inner surfaces of the bellows with a masking agent that prevents adhesion of the fluidic precursor; and optionally, after the curing step, removing the masking agent from the inner surfaces of the bellows.

8. The method of claim 7, wherein the masking agent is photoresist, oil, silane and/or alkoxysilanes.

9. The method of claim 1, wherein steps (a)-(c) are repeated.

10. The method of claim 1, wherein the coating is resistant to halogen containing process gases.

11. The method of claim 1, wherein the corrosion-resistant material coating has a thickness of 0.0014 to 0.0034 inch.

\* \* \* \* \*